United States Patent [19]
Brunolli

[11] Patent Number: 5,298,815
[45] Date of Patent: Mar. 29, 1994

[54] CASCODE AMPLIFIER CIRCUITRY FOR AMPLIFYING DIFFERENTIAL SIGNALS

[75] Inventor: Michael J. Brunolli, Escondido, Calif.

[73] Assignee: Brooktree Corporation, San Diego, Calif.

[21] Appl. No.: 683,259

[22] Filed: Apr. 10, 1991

Related U.S. Application Data

[60] Continuation of Ser. No. 314,931, Feb. 24, 1989, abandoned, which is a division of Ser. No. 810,911, Dec. 18, 1985, Pat. No. 4,905,189.

[51] Int. Cl.$^5$ .................... H03F 3/45; G11C 11/419
[52] U.S. Cl. ...................... 307/530; 365/189.09; 365/205; 365/206; 365/207; 365/230.05; 365/190
[58] Field of Search .............. 365/190, 189.09, 230.05, 365/205, 206, 207, 208; 307/530

[56] References Cited

U.S. PATENT DOCUMENTS

| 3,967,252 | 6/1976 | Donnelly | 365/189.09 |
| 4,300,213 | 11/1981 | Tanimura et al. | 365/190 |
| 4,507,759 | 3/1985 | Yasui et al. | 365/190 |
| 4,651,302 | 3/1987 | Kimmel et al. | 307/530 |
| 4,725,984 | 2/1988 | Ip et al. | 365/190 |
| 4,791,607 | 12/1988 | Igarashi et al. | 365/230.05 |

FOREIGN PATENT DOCUMENTS 0136811 4/1985 European Pat. Off.

OTHER PUBLICATIONS

Wyland, "FET Cascode Technique Optimizes Differential Amplifier Performance," Electronics, Jan. 18, 1971, pp. 81-84.

*Primary Examiner*—Glenn Gossage
*Attorney, Agent, or Firm*—Ellsworth R. Roston; Charles H. Schwartz

[57] ABSTRACT

Amplifying circuitry for use in a random access memory includes first and second input lines and receives complementary differential signals which respectively represent a binary "1" and a binary "0". The differential signals are respectively applied to first and second transistors connected to provide a rejection of the common mode in the differential signals. Third and fourth transistors also respectively receive the differential signals on the first and second lines. The third and fourth transistors operate as cascode transistors to respectively provide outputs on first and second output lines in accordance with the amplitudes of the signals on the first and second input lines. Fifth and sixth transistors are respectively connected to the third and fourth transistors to limit the currents through the third and fourth transistors.

16 Claims, 4 Drawing Sheets

CASCODE AMPLIFIER CIRCUITRY FOR AMPLIFYING DIFFERENTIAL SIGNALS

This is a continuation of application Ser. No. 07/314,931 filed Feb. 24, 1989, now abandoned, which in turn is a division of application Ser. No. 06/810,911 filed Dec. 18, 1985, now U.S. Pat. No. 4,905,189.

FIELD OF THE INVENTION

This invention relates to a system for reading information from a random access memory and writing information in such a memory. The invention further relates to a system for providing such reading and/or writing at relatively high frequency of at least one hundred and twenty five (125) megahertz. The invention particularly relates to a system for simultaneously reading binary coded information from a random access memory on a synchronous basis relative to clock signals at a suitable frequency such as approximately one hundred twenty five (125) megahertz and simultaneously reading binary coded information from, or recording binary coded information into, the random access memory on an asynchronous basis relative to the clock signals.

BACKGROUND OF THE INVENTION

Random access memories are provided for storing binary coded information. These memories are versatile because the binary information at different positions in the memory can be read from the memory and because binary coded information can be written in the memory at any desired position to update information previously stored in the memory at such positions. The information read from the memory can be processed by a digital computer or a data processor to obtain certain desired operations such as the movements of a control mechanism and the information written into the memory to update the memory may be obtained from the actual movements of the control mechanism. In this way, any differences between the actual and desired movements of the control mechanism can be corrected.

Random access memories now in use have certain limitations. These result in large part from limitations in the operation of the read/writing system associated with the memory for reading information from the memory or writing information into the memory. One of these limitations results from the inability of the read/write system simultaneously to read information from one position in the memory and write information into a second position in the memory. A further limitation results from the limited speed in reading information from the memory or writing information into the memory. This limited speed in turn curtails the speed at which the digital computer or data processing system associated with the memory is able to process information. A third limitation results from the inability of the system to read binary coded information from the memory on a synchronous basis relative to the clock signals and simultaneously read binary coded information from, or record binary coded information into, the memory on an asynchronous basis relative to the clock signals.

A considerable effort has been made over an extended number of years to provide a random access memory system which will overcome the limitations discussed in the previous paragraph. Such effort has been particularly intense in view of the rapid expansion of data processing. In spite of such efforts, the capabilities of the random access memory systems still trail the capabilities of the associated data processors and accordingly impose limitations on the operation of these data processors.

SUMMARY OF THE INVENTION

In one embodiment of the invention, first and second input lines respectively receive differential signals which are complementary to each other and which respectively represent a binary "1" and a binary "0". The differential signals are respectively applied to first and second transistors connected to provide a rejection of the common mode in the differential signals. Each of these transistors may have a source common with a respective one of the first and second lines. Third and fourth transistors also respectively receive the differential signals on the first and second lines. The third and fourth transistors operate as cascode transistors to respectively provide outputs on first and second output lines in accordance with the amplitudes of the signals on the first and second input lines. Fifth and sixth transistors are respectively connected to the third and fourth transistors to limit the currents through the third and fourth transistors. The first, third and fifth transistors may be in series, and the second, fourth and sixth transistors may be in series. The first through fourth transistors may be n-channel transistors, and the fifth and sixth transistors may be p-channel transistors.

DETAILED DESCRIPTION OF THE DRAWINGS

Figure 1:
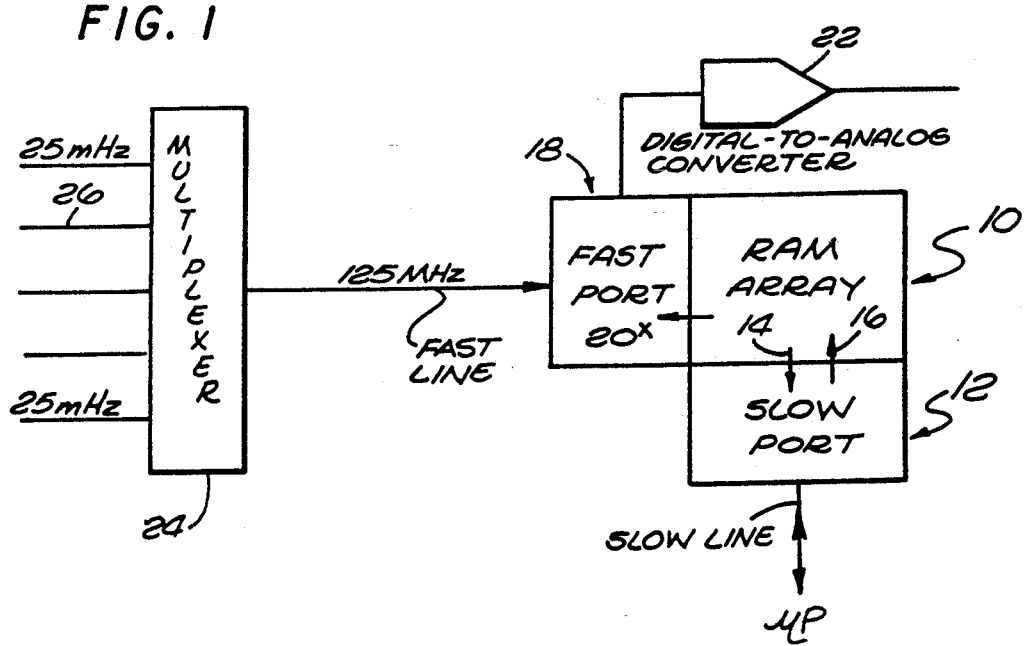
FIG. 1 is a schematic block diagram of a random access memory and of a system for reading first bits of information from first positions in the memory on a synchronous basis relative to the clock signals and simultaneously reading second bits of information from, or writing second bits of information into second positions in the memory on an asynchronous basis relative to the clock signals without having the reading of the first bits of information from the memory affect the reading or writing of the second bits of information.

FIG. 1 illustrates one embodiment of the invention in block form. The embodiment shown in FIG. 1 includes a random access memory generally indicated at 10. The random access memory stores a plurality of bits of binary coded information in an array in which the position of each binary coded bit in the array is identified by an individual distance along a pair of coordinate axes such as an x-axis and a y-axis. The random access memory provides an erasable storage of binary coded information in which the binary coded information at different positions in the memory can be constantly updated. Random access memories are commercially available which can store tens, and even hundreds, of thousands of bits of binary coded information in an array in a relatively small area. The binary coded information may be represented by logic levels of signals in which a first logic level or amplitude represents a binary "1" and a second logic level represents a binary "0".

A slow port generally indicated at 12 is associated with the random access memory 10. The port 12 is adapted to read information from specified positions in the memory 10 or to write binary information into specified positions in the memory. The reading of such binary coded information from the memory 10 is indicated by an arrow 14 and the writing of such information into the memory is indicated by an arrow 16. The reading and writing of such binary coded information may occur on an asynchronous basis relative to clock signals at a suitable frequency such as 125 megahertz.

A fast port generally indicated at 18 is also associated with the memory 10. As indicated by an arrow 21, the fast port 18 is adapted to read information from the memory 10 on a synchronous basis relative to the clock signals at a relatively high frequency such as frequencies of at least 125 megahertz. This frequency is considerably higher than the frequency of the signals in the slow port 12. The signals read in the fast port 18 may be introduced to a digital-to-analog converter 22 which converts the binary signals from the fast port 18 into corresponding analog signals for subsequent processing.

In order to obtain the reading of signals in the fast port 18, the operation of the fast port 18 may be controlled by a multiplexer 24. The multiplexer 24 receives signals at a reduced frequency, such as approximately twenty-five megahertz (25 Mhz), on a plurality (such as 5) of lines 26. The signals on each of the lines 26 are shifted in phase relative to the signals in the other ones of the lines 26. When these signals are combined in the multiplexer 24, the output of the multiplexer is at approximately 125 megacycles.

Figure 2:
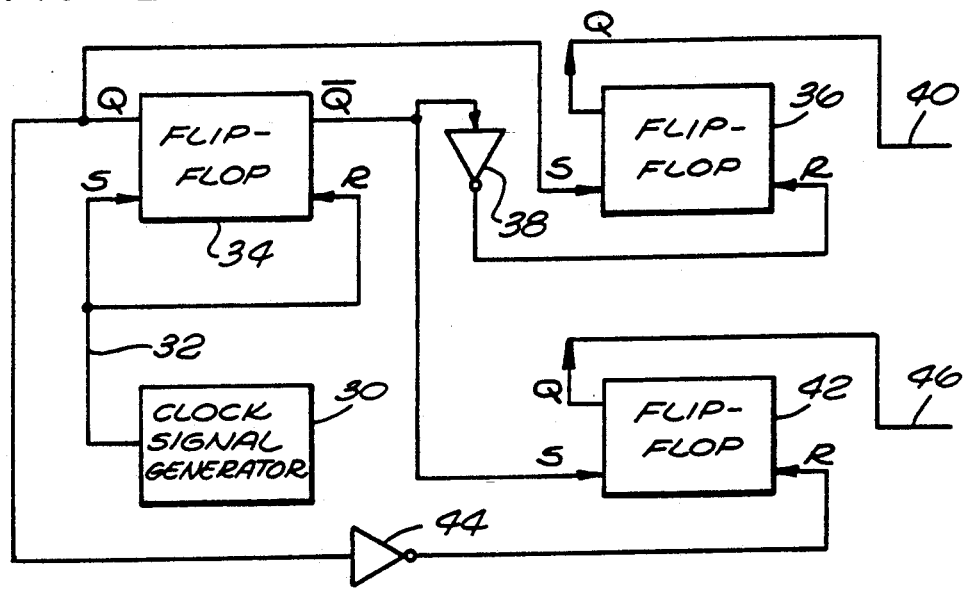
FIG. 2 is a block diagram of a system for producing synchronizing signals for use in the read-write system of FIG. 1.
Figure 3:
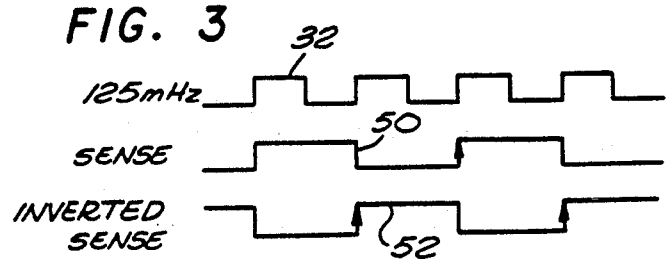
FIG. 3 illustrates waveforms of clock signals which are produced by the system shown in FIG. 2.

FIG. 2 illustrates in block form a system for generating clock signals. The system shown in FIG. 2 includes a clock signal generator 30 which produces signals 32 at a particular frequency such as one hundred and twenty-five megahertz (125 mhz). These signals 32 are illustrated in FIG. 3. The signals from the clock generator 30 are introduced to set S and reset R input terminals of a flip-flop 34 also having Q and $\bar{Q}$ output terminals. The true output terminal of the flip-flop 34 is connected to the set S input terminal of a flip-flop 36. The reset R output signals from the flip-flop 34 are amplified and inverted by an amplifier-inverter 38 and are introduced to the reset R input terminal of the flip-flop 36. An output line 40 extends from the $\bar{Q}$ output terminal of the flip-flop 36.

Similarly, a connection is made from the $\bar{Q}$ output terminal of the flip-flop 34 to the set S input terminal of a flip-flop 42. The reset R input terminal of the flip-flop 42 receives the signals from an amplifier-inverter 44 corresponding in construction and operation to the amplifier-inverter 38. The input of the amplifier-inverter 44 receives the signals on the Q output terminal of the flip-flop 34. The $\bar{Q}$ output terminal of the flip-flop 42 is connected to an output line 46.

The flip-flop 34 is alternately triggered to the true and false (high and low) states when the signal 32 changes from a low level to a high level. The flip-flop 34 accordingly produces the signals 32 in FIG. 3. When the Q output of flip-flop 34 is triggered to the true(high) state, it triggers the Q output of the flip-flop 36 to the high state. At the next low to high transition of the clock signals 32, the flip-flop 34 is again triggered to the high state. This causes a low signal to be produced on the Q terminal of the flip-flop 34. This signal is inverted by the amplifier-inverter 38 to trigger the flip-flop 36 to the reset R state. In this way, synchronizing signals are produced on the output terminal 40 with a frequency one-half ($\frac{1}{2}$) that of the clock signals 32 and with a phase as indicated at 50 in FIG. 3. The flip-flop 42 also produces synchronizing signals 52 with a frequency one-half ($\frac{1}{2}$) that of the clock signals 32 but with a phase opposite to the phase of the signals 50 in FIG. 3. The signals 52 produced by the flip-flop 42 are introduced to the line 46.

Figure 4:
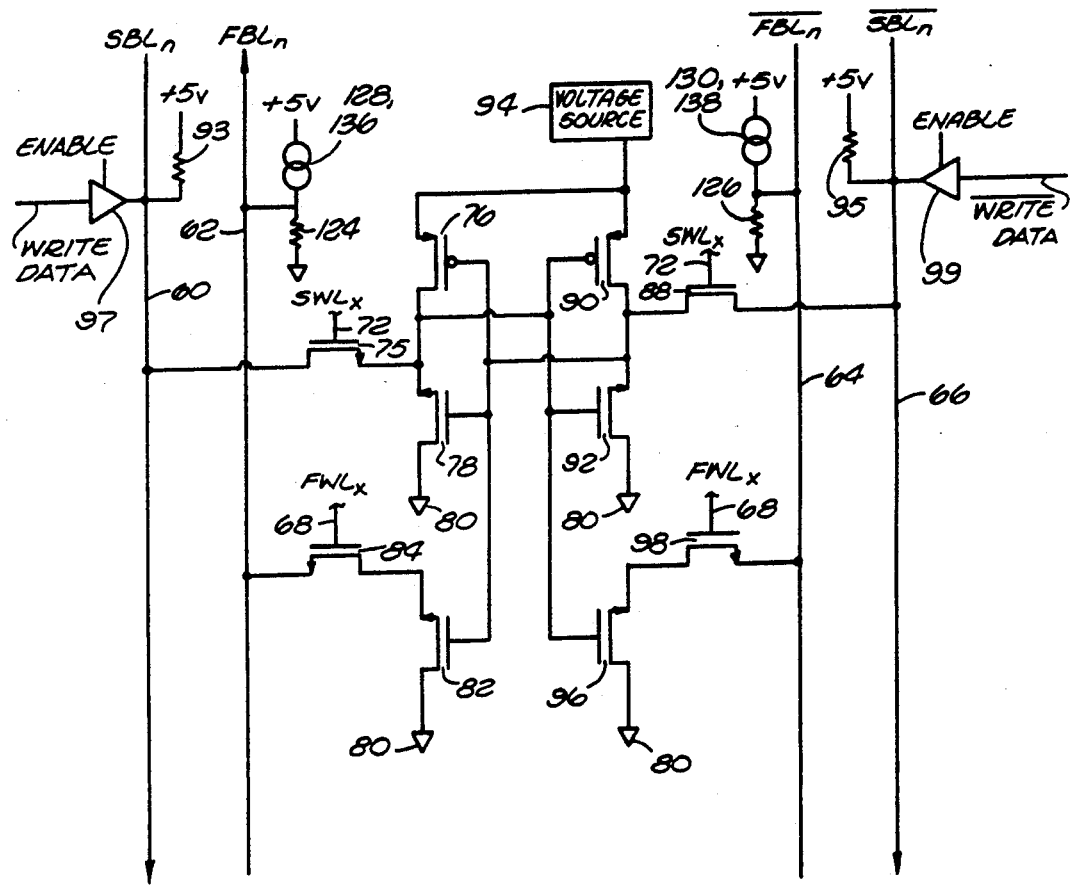
FIG. 4 is a diagram of circuitry which is used in the read-write system shown in FIG. 1 to read first bits of information from a first position in the memory and simultaneously read second bits of information from, or write second bits of information into, second positions in the memory without having the reading of the first bits of information from the memory affect the reading or writing of the second bits of information.

FIG. 4 illustrates circuitry for reading information into the fast port 18 and reading information in, or recording information from, the slow port 12 in FIG. 2. The circuitry shown in FIG. 4 provides for the processing of information in the slow port 12 without any interference from the reading of information in the fast port 18. The circuitry shown in FIG. 4 includes lines 60, 62, 64, 66, 68 and 72. The lines 60 and 66 provide signals respectively coded for logic states of binary "1" and binary "0" to be processed in the slow port 12. These signals are respectively indicated as "$SBL_n$" and "$\overline{SBL}_n$". Similarly, the lines 62 and 64 provide signals respectively coded for logic states of binary "1" and binary "0" to be processed in the fast port 18. These signals are respectively indicated as "$FBL_n$" and "$\overline{FBL}_n$".

The line 72 provides signals coded for the "x" word to be processed in the slow port 12. These signals are indicated as "$SWL_x$". In like manner, the line 68 provides signals coded for the "x" word to be processed in the fast port 18. These signals are indicated at "$FWL_x$". In other words, the logic levels of signals in the lines 60 and 66 indicate the value of the $n^{th}$ bit in the x word for the slow port and the lines 62 and 64 indicate the value of the $n^{th}$ bit in the x word for the fast port.

The signals on the line 60 are introduced to the drain of an n-channel transistor (hereinafter referred to as an n-transistor) 75, the gate of which receives signals from the line 72. The source of the transistor 75 is connected to the drain of a p-channel transistor (hereinafter referred to as p-transistor) 76 and to the drain of an n-transistor 78, the drain of which is connected to a suitable reference potential such as a ground 80. The gates of the transistors 76 and 78 have a common connection with the gate of an n-transistor 82. The drain of the transistor 82 may be common with the reference potential such as the ground 80. The source of the transistor 82 is connected to the drain of an n-transistor 84. The gate of the transistor 84 receives signals from the line 68 and the source of the transistor 84 receives signals from the line 62.

The line 66 is connected to the source of an n-transistor 88, the gate of which receives signals from the line 72. The drain of the transistor 88 has a common connection with the drain of a P-transistor 90 and the source of an n-transistor 92. The source of the transistor 90 receives an energizing potential such as approximately +5 volts from a suitable voltage source 94, which is also connected to the source of the transistor 76. The gates of the transistors 90 and 92 have a common connection with the drain of the transistor 76, the source of the transistor 78 and the gate of a transistor 96. The drain of the transistor 90 and the drain of the transistor 92 have a common connection with the gates of the transistors 76 and 78. The drain of the transistor 96 is connected to the reference potential such as the ground 80. The source of the transistor 96 and the drain of an n-transistor 98 have a common potential. The gate of the transistor 98 receives the signals on the line 68 and the source of the transistor 98 receives the signals on the line 64.

Amplifiers 97 and 99 are respectively connected to the lines 60 and 66. The amplifiers are activated by signals on "Enable" lines. When the amplifiers 97 and 99 are enabled, they pass "write" signals through the amplifiers. The "write" signals passing through the amplifiers 97 and 99 respectively represent a binary "true" and a binary "false".

Current sources 136 and 138 are shown in FIG. 4 as being connected to the lines 62 and 64. These current sources correspond to transistors 136 and 138 in FIG. 6. Resistors 124 and 126 are shown in FIG. 4 as being respectively connected between the signal generators 136 and 138 and the reference potential such as ground. The resistors 124 and 126 are respectively shown as transistors 124 and 126 in FIG. 6. Resistances 93 and 95 are also respectively connected between the lines 60 and 66 and the voltage source 94.

The transistor 84 becomes conductive when a signal of high amplitude is produced on the line 68 to indicate the selection of a particular word, such as the "x" word, and a high signal is simultaneously produced on the line 62 (if the transistor 82 is non-conductive) to indicate a binary value of "1" for a particular bit, such as the "n" bit, in the selected word. When the transistor 84 becomes conductive, current flows through a circuit including the line 62, the transistor 84 and the transistor 82 if the transistor 82 is conductive. This current indicates that the particular bit in the selected word has a binary value of "1". A high impedance in the transistor 82 isolates the current in the line 62 from the reading and recording of information in the lines 60 and 66 at the "x" word and the "n" bit.

In like manner, current flows through a circuit including the line 64, the transistor 98 and the transistor 96 when a signal of high amplitude is produced on the line 68 to indicate the selection of a particular word such as the "x" word, and a signal of high amplitude is simultaneously produced (if the transistor 96 is conductive) on the line 64 to indicate a binary value of "0" for the bit, such as the "n" bit, in the $\overline{FBL}$ line in that word.

A high impedance in the transistor 96 isolates the current in the line 64 from the reading and recording of information in the lines 60 and 66 at the "x" word and the "n" bit.

The operation of the circuitry shown in FIG. 4 may be seen from several examples. In one example, a binary value of "1" may be read by the fast port 18 in FIG. 1 at the "n" bit of the "x" word. Under such circumstances, the transistors 84 and 98 may become conductive because of the introduction of a high voltage to their gates from the line 68. Because of the interconnections between the gate of each of the transistors 76 and 90 and the source of the other one of such transistors, the transistors 76 and 90 operate as a flip-flop. Thus, only one of the transistors 76 and 90 can be conductive at any one time. As a result, assuming that a high voltage is produced on the drain of the transistor 76, a low voltage is simultaneously produced on the drain of the transistor 90. The low voltage on the drain of the transistor 90 prevents the transistor 82 from being conductive and prevents current from flowing through a circuit including the line 62, the transistor 84 and the transistor 82.

The high voltage on the drain of the transistor 76 is introduced to the gate of the transistor 96 to make the transistor 96 conductive. This causes current to flow through a circuit including the current source 138, the line 64, the transistor 98 and the transistor 96. This current causes the current normally flowing through the resistance 126 from the signal generator 138 to be reduced. However, the current normally flowing through the current source 136 and the resistance 124 continues to be maintained because of the non-conductivity of the transistor 82. This causes the voltage on the line 64 to be reduced relative to the voltage on the line 62. This voltage difference indicates a reading of a binary "1" in the fast port 18.

In the next example, a binary "1" is read from the memory 10 by the slow port 12 at the "n" bit of the "x" word. Under such circumstances, a high voltage is introduced to the gates of the transistors 75 and 88 to provide for these transistors to become conductive. The resultant high voltage on the drain of the transistor 75 is introduced to the gate of the transistor 92 to make the transistor 92 conductive. Current accordingly flows through a circuit including the +5 v voltage source 94, the resistance 95, the transistor 88 and the transistor 92. The resultant voltage drop across the resistance 95 causes the voltage on the line 66 to be less than the voltage on the line 60. This voltage difference indicates the reading of a binary "1" by the slow port 12.

The transistor 88 has a higher impedance than the transistor 92. This causes a relatively low voltage to be produced on the source of the transistor 92. This voltage is introduced to the gate of the transistor 78 to make the transistor 78 non-conductive. As a result, current cannot flow through a circuit including the line 60, the transistor 75 and the transistor 78. This maintains the voltage on the line 60 higher than the voltage on the line 66 as discussed in the previous paragraph.

In the third example, a binary "1" is written in the memory 10 by the slow port 12 at the "n" bit of the "x" word. Because the "x" word is being activated, the voltage on the gate of the transistor 75 is high. At this instant, the amplifiers 97 and 99 are enabled by a signal on the "enabled" line. Upon being enabled, a "write" signal is introduced by the amplifier 97 to the line 60 as a positive voltage. At the same time, a voltage having the reference such as ground is introduced as a write signal to the line 66 through the amplifier 99. This low voltage is introduced to the source of the transistor 88. A current is accordingly forced by the amplifier 99 to flow through a circuit including the voltage source 94, the transistor 90, the transistor 88 and the line 66.

The high voltage on the line 72 causes the transistor 75 to become conductive so that a high voltage from the line 60 is produced on the source of the transistor 75. This voltage is introduced to the gate of the transistor 92 to make the transistor 92 conductive. Current accordingly flows through a circuit including the voltage source 94, the transistor 90 and the transistor 92. Since the transistor 90 has a considerably higher impedance than the transistor 92, this current flow causes the voltage on the source of the transistor 92 to have a potential approaching the reference potential such as ground. This voltage is introduced to the gate of the transistor 78 to maintain the transistor 78 non-conductive and thereby maintain the high potential on the source of the transistor 75.

The arrangement described above is advantageous in that the same bit of information may be simultaneously read from the memory 10 (denoted as the "RAM" in FIG. 1) by the fast port 18 and the slow port 12. Actually, the fast port 18 may read the binary coded information previously recorded as the value of a particular position in the memory while the slow port 12 may be writing new binary coded information for that position in the memory. The arrangement shown in FIG. 4 accomplishes this by providing the high gate impedances in the transistors 82 and 96. These high gate impedances isolate, from the slow bit lines 60 and 66 of the slow port 12, any disturbances resulting from the reading through the fast port 18 of the binary coded information from the particular position in the memory 10. As a result, when there is a time coincidence with the writing of binary coded information through the slow port 12 in the particular position in the memory, any disturbances resulting from such reading through the fast port of the binary coded information from the particular position in the memory will be prevented from affecting the writing through the slow port 12 of such binary coded information in the particular position in the memory 10 in such a time coincidence.

Figure 5:
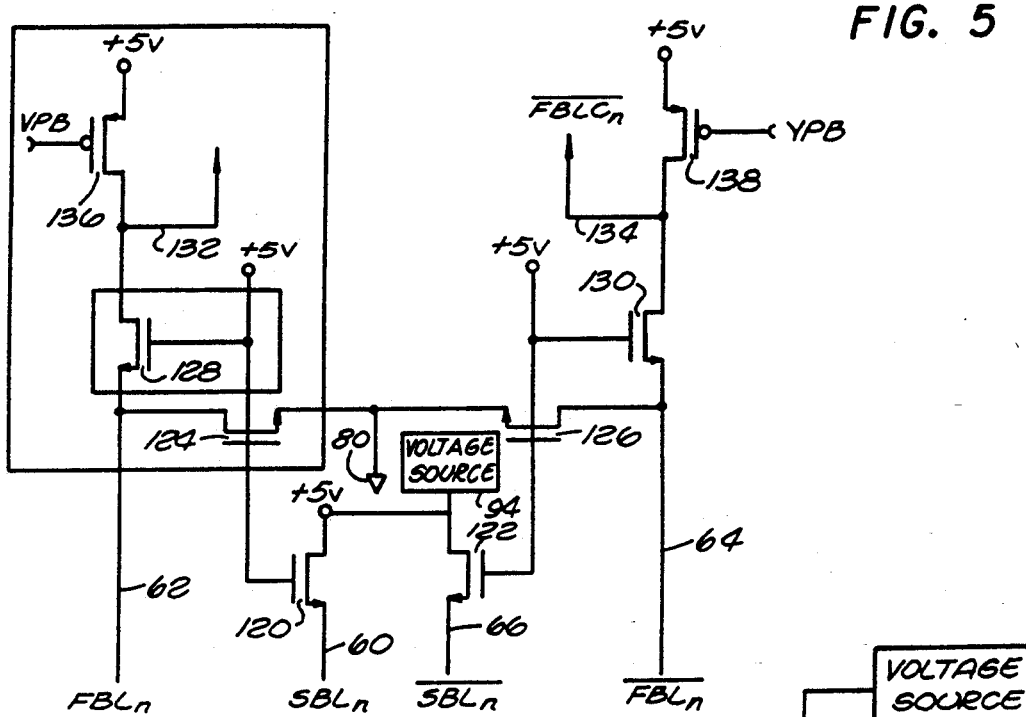
FIG. 5 is a diagram of circuitry for amplifying signals produced by the circuitry shown in FIG. 4 and for providing the amplified signals with optimal characteristics.

FIG. 5 illustrates circuitry for processing the currents flowing in the lines 60, 62, 64 and 66 in FIGS. 4 and 5 so that the signals have a common mode and the deviations of the signals from the common mode represent binary information. The circuitry shown in FIG. 5 includes the lines 60, 62, 64 and 66. The lines 60 and 66 are respectively connected to the sources of n-transistors 120 and 122 having their drains connected to the voltage source 94. Connections are respectively made from the gates of the transistors 120 and 122 to the voltage source 94. The drains of the transistors 124 and 126 are respectively connected to the lines 62 and 64. The sources of the transistors 124 and 126 receive the reference potential such as the ground 80.

The gates of the transistors 120 and 122 are also respectively connected to gates of n-transistors 128 and 130 and are connected to receive a positive potential from the voltage source 94. The sources of the transistors 128 and 130 respectively receive the signals on the lines 62 and 64. The signals on the drains of the transistors 128 and 130 are respectively applied to intermediate output lines 132 and 134 and are also respectively applied to the drains of p-transistors 136 and 138. The sources of the transistors 136 and 138 have a positive potential such as +5 volts applied from the voltage source 94. The gates of the transistors 136 and 138 have a voltage bias (indicated as "VPB") applied to them to bias the transistors to produce a low current.

The transistors 128 and 130 respectively operate as cascode amplifiers. This causes a gain on the order of 1.5 to 2 to be produced in each of these cascode amplifiers when a signal is introduced to a particular one of the lines 64 and 66 associated with that amplifier. The signal produced as a result of the operation of the cascode amplifier 128 is introduced to the line 132 and the signal produced as a result of the operation of the cascode amplifier 130 is introduced to the line 134.

The transistors 136 and 138 are biased, by the voltages applied to their gates, to produce a low current in the transistors at all times. The low current in the transistor 136 flows through the cascode amplifier defined by the transistor 128 and through the transistor 124 to the reference potential such as the ground 80. Similarly, the current through the transistor 138 flows through the cascode amplifier defined by the transistor 130 and through the transistor 126 to the reference potential such as the ground 80. The relatively low currents through the transistors 124 and 126 are substantially constant because of the constant voltages on the sources and gates of the transistors. These currents tend to lower the impedances on the sources of the transistors 128 and 130 and tend to establish a common mode between the lines 62 and 64. In this way, the voltage swings in these lines from the common mode represent binary information and tend to speed the response of the circuits to binary information.

Figure 6:
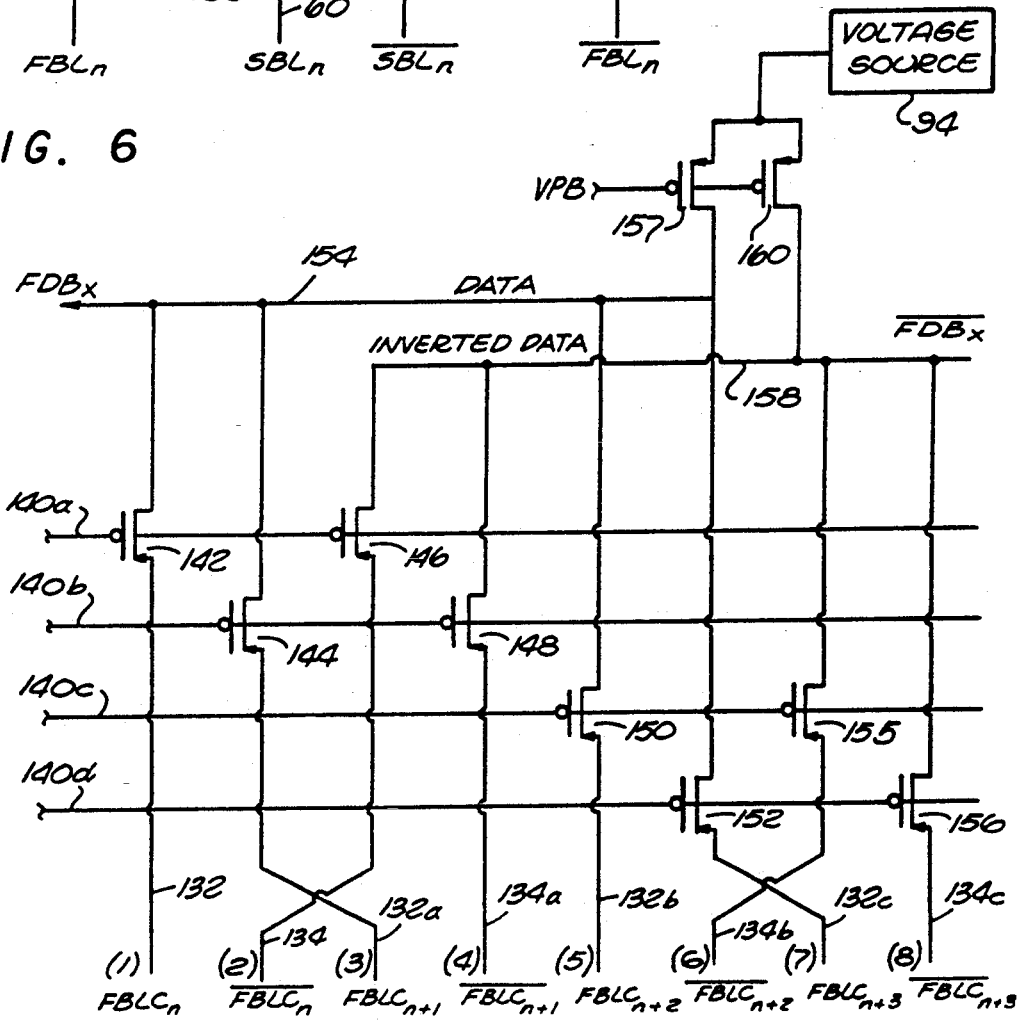
FIG. 6 is a schematic diagram of circuitry for randomly activating a plurality of channels and for introducing to a pair of buses, in accordance with the activation of the different channels, the amplified signals produced by circuitry as shown in FIG. 5.
Figure 7:
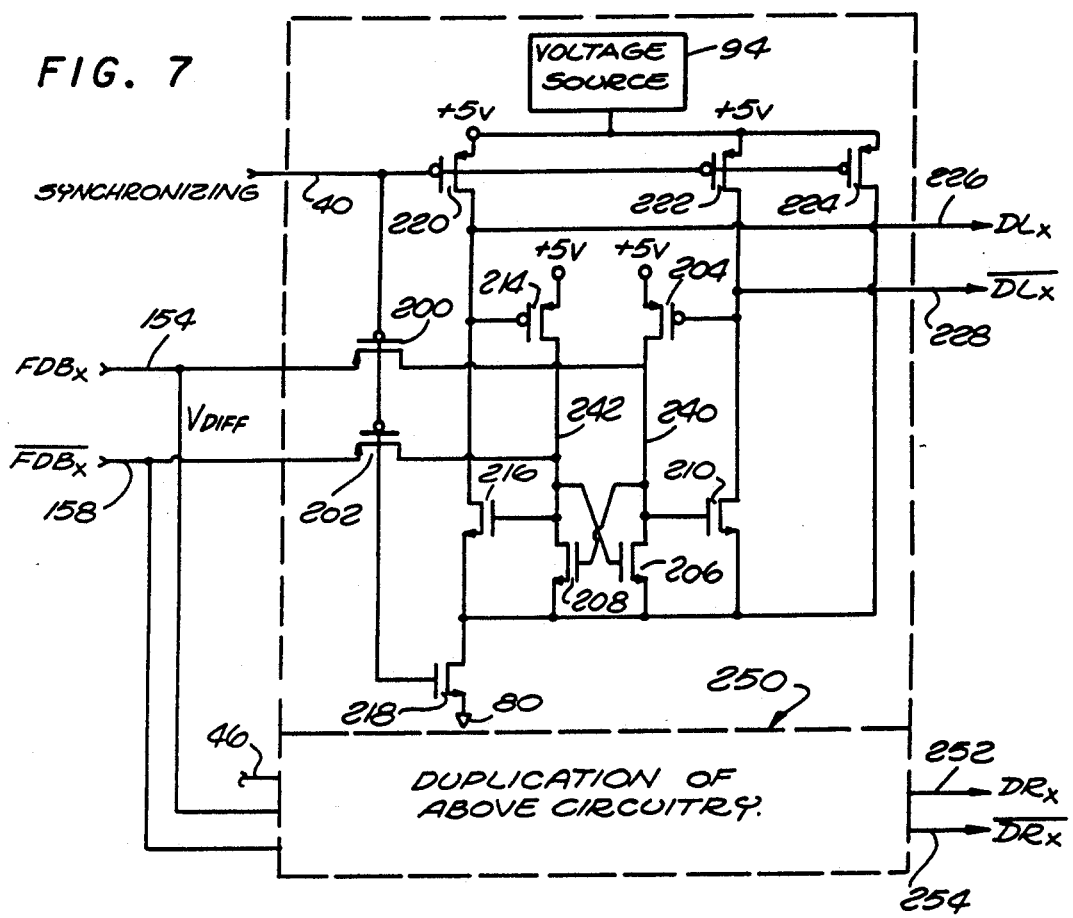
FIG. 7 is a schematic diagram of circuitry for sampling signals from the buses of FIG. 6 during a first half cycle of the synchronizing signals and for evaluating the sampled signals upon a second half cycle of the synchronizing signals and for introducing the evaluated signals to pairs of output lines.

The intermediate lines 132 and 134 are also shown in FIG. 6. These lines are designated in FIG. 6 as "FBLC$_n$" and "$\overline{FBLC}_n$". Other corresponding pairs of lines are indicated in FIG. 7 at 132a and 134a, (respectively designated as "FBLC$_{n+1}$" and "$\overline{FBLC}_{n+1}$"), 132b and 134b (respectively designated as "FBLC$_{n+2}$" and "$\overline{FBLC}_{n+2}$") and 132c and 134c, (respectively designated as "FBLC$_{n+3}$" and "$\overline{FBLC}_{n+3}$"). A plurality of channels are also indicated in FIG. 6 at 140a, 140b, 140c and 140d. The channels 140a, 140b, 140c and 140d, 140c and 140d activate a particular column in the memory 10 and the lines 132 and 134, 132a and 134a, etc. activate a particular row in the memory 10. The bit common to the activated rows and columns in the memory 10 is then selected, this particular bit being common to a selected row and a selected column.

The lines 132, 134, 132a, 134a, 132b, 134b, 132c, and 134c respectively have common connections with the drains of p-transistors 142–156 (even numbers only). The signals on the channel 140a are introduced to the gates of the transistors 142 and 146; the signals on the channel 140b are introduced to the gates of the transistors 144 and 148; the signals on the channel 140c are introduced to the gates of the transistors 150 and 154; and the signals on the channel 140d are introduced to the gates of the transistors 152 and 156.

The drains of the transistors 142, 144, 150 and 152 have a common connection with a bus 154 and with the drain of a p-transistor 157. Similarly, the drains of the transistors 146, 148, 155 and 156 have a common connection with a bus 158 and with the drain of a p-transistor 160. The gates of the transistors 157 and 160 are biased to produce a current of relatively low amplitude through, the transistors. A voltage is applied to the sources of the 157 and 160 from the voltage source 94.

The circuitry of FIG. 6 constitutes a switching matrix. For example, when the amplitude of the signal on the line 32 is high and the channel 140a is energized, current flows through the bus 154 and the transistor 142. Similarly, when a signal is produced on the line 134a to represent a binary "0" and the channel 140b is activated, current flows through the bus 158 and transistor 148.

The transistors 157 and 160 operate in a common mode similar to the operation of the transistors 124 and 126 in FIG. 5. As a result of their common mode operation, the transistors 157 and 160 insure that any variations in the voltages on the lines 154 and 158 represent binary coded information. As will be appreciated, the signals produced in the lines 154 and 158 represent signals read from the memory 10 by the fast port 10. The signals on the buses 154 and 158 are respectively represented as "$FDB_x$" and "$\overline{FDB}_x$".

The buses 154 and 158 of FIG. 6 are also shown in FIG. 7. The synchronizing signal lines 40 and 46 of FIG. 2 are also shown in FIG. 7. The signals on the lines 154 and 158 are respectively introduced to the sources of p-transistors 200 and 202 and the signals on the clock line 40 are introduced to the gates of these transistors. The drain of the transistor 200 has common connections with the drain of a p-transistor 204, the drain of an n-transistor 206, the gate of an n-transistor 208 and the gate of an n-transistor 210. Similarly, connections are made from the drain of the transistor 202 to the drain of a p-transistor 214, the drain of the transistor 208, the gate of the transistor 206 and the gate of an n-transistor 216.

The sources of the transistors 204 and 214 receive a positive potential from the voltage source 94. The sources of the transistors 206, 208, 210 and 216 have a common connection with the source of an n-transistor 218. The drain of the transistor 218 is common with the reference potential such as the ground 80. The gate of the transistor 218 receives the signals on the synchronizing line 40.

The synchronizing line 40 is also connected to the gates of p-transistors 220, 222 and 224. The sources of the transistors 220, 222 and 224 receive a positive potential from the voltage source 94. The drain of the transistor 220 has common connections with the gate of the transistor 214 and the drain of the transistor 216 and with an output line 226. The output line 226 is designated as "$DL_x$". Output connections are made from the drain of the transistor 222 to the gate of the transistor 204, the source of the transistor 210 and an output line 228. The output line 228 is designated as "$\overline{DL}_x$". The drain of the transistor 224 has a common connection with the drain of the transistor 218.

When the amplitude of the clock signal on the line 40 is low, the transistor 200 becomes conductive. A signal of high amplitude from the line 154 is accordingly applied to a line 240 common to the drain of the transistor 204 and the source of the transistor 206. This signal has a higher amplitude than the signal on a line 242 common to the source of the transistor 214 and the drain of the transistor 208. The reason is that the transistor 202 remains non-conductive because of a low voltage on the line 158.

Upon the occurrence of a high amplitude in the clock signal on the line 40, the transistor 218 becomes conductive. This causes the voltage on the drain of the transistor 218 to decrease to substantially the reference potential such as the ground 80. Because of the high potential on the line 240, the transistor 208 becomes conductive and produces on its drain a potential approaching the reference potential such as the ground 80. This voltage is applied to the gate of the transistor 206 to insure that the transistor 206 will remain non-conductive.

When the voltage on the drain of the transistor 218 approaches the reference potential such as the ground 80, the transistor 210 becomes conductive because of the application of the high voltage to its gate from the line 240. This causes the voltage on the bus 228 to approach the reference potential such as ground. The resultant reference potential, such as the ground 80, on the gate of the transistor 204 causes the transistor 204 to become conductive. This extends the time for the production of a voltage of high amplitude on the line 240 and insures that the transistors 208 and 210 will be strongly conductive.

In the next half cycle (the negative half cycle) of the synchronizing (or clock) signal 50 on the line 40, the transistors 220, 220 and 222 become conductive. When the transistors 222 and 224 become conductive, the same voltage (the voltage from the voltage source 94) is applied to the lines 226 and 228 to assure that any difference in the potentials on these lines in the previous half cycle of the synchronizing signal is eliminated. This insures that a considerable difference in potential will be produced in the lines 226 and 228 in the subsequent half cycle (the positive half cycle) of the synchronizing signals on the line 40. When the transistor 224 becomes conductive in the negative half cycle of the synchronizing signal 50 on the line 40, it provides a positive voltage to the source of the transistor 208 to insure that the transistor will become conductive in the subsequent half cycle (the positive half cycle) of the clock signals.

When a positive signal is produced on the line 158, and thus a negative signal is produced on the line 154, to indicate a binary value of "0", the signal on the line 242 has a higher amplitude than the signal on the line 240 during the negative half cycle of the synchronizing signal 50 on the line 40. As a result, when the transistor 218 becomes conductive in the next half cycle (the positive half cycle) of the synchronizing signal 50, the transistors 206 and 216 become conductive and the voltage on the line 226 approaches the reference potential such as the ground 80.

Figure 8:
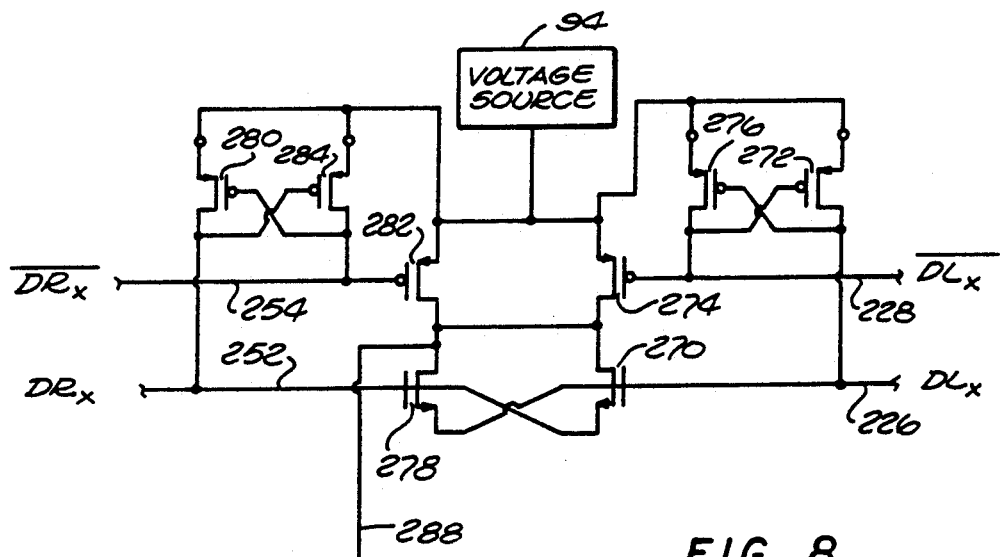
FIG. 8 is a schematic diagram of circuitry for processing the signals produced on the output lines in FIG. 7 to introduce the signals from only one of the output lines to a resultant line at each instant.

The circuitry shown in detail in FIG. 7 and described above is duplicated in second stages which are included within a box generally indicated at 250 and shown in the broken lines in FIG. 7. However, the stages 250 receive the synchronizing signals 52 on the clock line 46. Since these signals are displaced by 180° in phase from the synchronizing signals 50 on the line 46, the signals produced on output lines 252 and 254 are displaced in phase by 180° from the signals produced on the lines 226 and 228. The signals on the output lines 252 and 254 are respectively indicated as "$DR_x$" and "$\overline{DR}_x$" in FIG. 8. In other words, the signals produced in the lines 154 and 158 in one half cycle of the synchronizing signals 46 in FIG. 1 in the stage 250 are sampled while the signals produced on the lines 154 and 158 in the previous half cycles of the synchronizing signals 46 are evaluated on the output lines 226 and 228. In the next half of the synchronizing signals 46, the signals sampled in the stage 250 are evaluated on the output lines 226 and 228 while the stage shown in detail in FIG. 8 is sampling the signals on the lines 226 and 228.

The circuitry shown in FIG. 9 includes the lines 226 and 228 and the line 226 is connected to the gates of transistors 270 and 276; the line 228 is connected to the gates of transistors 274 and 272; the line 252 is connected to the gates of transistors 278 and 284; and the line 254 is connected to the gates of transistors 280 and 282. The transistors 270 and 278 are n-transistors and the transistors 272, 276, 274, 280, 282 and 284 are p-transistors. Connections are also respectively made from the lines 226 and 228 to the drains of the transistor 272 and 276. Similarly, the lines 252 and 254 are respectively connected to the drains of the transistors 280 and 284.

The sources of the transistors 272, 274, 276, 280, 282 and 284 receive a positive potential such as +5 volts from the voltage source 94. The drains of the transistors 274 and 282 are respectively common with the drain of the transistors 270 and 278. An output line 288 extends from a common connection between the drains of the transistors 274, 282, 270 and 278.

A signal of low amplitude is produced on only one of the lines 226, 228, 252 and 254 at any time to represent binary coded information and signals of relatively high amplitude are simultaneously produced on the other ones of the output lines 226, 228, 252 and 254. By way of illustration, a signal of low amplitude may be produced on the line 226 and a signal of high amplitude may be simultaneously produced on the lines 228, 252 and 254. When the amplitude of the signal on the line 226 is low, it introduces a low voltage to the source of the transistor 278. At the same time, a signal of high voltage is applied to the gate of the transistor 278 from the line 252. This causes the transistor 278 to become conductive so that the voltage on the source of the transistor approximates the voltage on the source of the transistor and a signal of low amplitude is produced on the output line 288. The low voltage on the drain of the transistor 278 also appears on the drain of the transistor 282 and the drain of the transistor 270 and prevents these transistors from becoming conductive.

To insure the operation of the transistors 270, 274, 278 and 282 as discussed above, the signals on the lines 226 and 228 are respectively applied to the transistors 272 and 276. These signals prevent the transistor 272 from becoming conductive and cause the transistor 276 to become conductive. This causes a high voltage to be produced on the drain of the transistor 276 and the gate of the transistor 274 to prevent the transistor 274 from becoming conductive.

As another illustration, it may sometimes happen that a signal of low amplitude is produced on the line 228. At the same time, signals of high amplitude are produced on the lines 226, 252 and 254. The signal of low amplitude on the line 228 is applied to the gate of the transistor 274 to make the transistor conductive. This causes the drain of the transistor 274 to have a high voltage, this voltage being applied to the resultant line 288. At the same time, the transistors 270 and 278 are not conductive. The reason is that each of these transistors has the same voltage on its gate and its source because of the high voltages on the lines 226 and 252. The transistor 282 is not conductive because a high voltage is applied to its gate from the line 254.

The transistors 272 and 276 operate to insure that the transistors 270, 274, 278 and 282 will operate as discussed in the previous paragraphs when the line 228 has a signal of low amplitude and the lines 226, 252 and 254 have signals of high amplitude. These signals prevent the transistor 276 from become conductive and cause the transistor 272 to become conductive. The resultant high voltage on the drain of the transistor 272 insures that the transistor 270 will remain non-conductive.

As will be seen, the circuit shown in FIG. 8 is symmetrical in that the lines 226 and 252 have the same connections and the lines 228 and 254 have the same connections. As a result, the discussion above with respect to the application of a signal of low amplitude on the line 226 is applicable to the application of a signal of low amplitude on the line 252. Similarly, the discussion above with respect to the application of a signal of low amplitude on the line 228 is also applicable to the application of a signal of low amplitude on the line 254.

The invention described above has certain important advantages. It provides for the reading of binary coded information from the memory 10 by the fast port 18 at the same time that binary coded information is read from, or written into, the memory 10 by the slow port 12. The simultaneous read/write action is obtained by the fast port 18 and the slow port 12 without any interference between the actions of the fast and slow ports. This results from the operation of the circuitry shown in FIG. 4 and described above. Actually, both the fast port 18 and the slow port 12 may simultaneously read the same bit of information from the memory.

The invention described above also has other important advantages. It provides for the reading of binary coded information by the fast port 18 on a synchronous basis with signals from the clock signal generator 30 but provides for the reading or writing of binary coded information by the slow port 12 on an asynchronous basis relative to the clock signals. This synchronous-asynchronous relationship between the operation of the fast port 18 and the slow port 12 is especially significant because the reading of binary coded information from the fast port 18 occurs at a high frequency such as approximately one hundred and twenty five megahertz (125 Mhz).

The operation of the fast port 18 also offers other important advantages in addition to those specified above. For example, the fast port 18 reads binary coded information from the random access memory 10 in each half cycle of the synchronizing signals 50 and 52 shown in FIG. 3. The fast port 18 samples, in a first stage, first bits of such binary coded information in the negative half cycles of the synchronizing signals 50 and evaluates the sampled information in the positive half cycles of the synchronizing signals. The fast port 18 samples, in a second stage identical in construction to the first stage, second bits of such binary coded information in the positive half cycles of the synchronizing signals 52 and evaluates the sampled information in the negative half cycles of the synchronizing signals.

In this way, the frequency of the fast port 18 in reading binary coded information from the memory 10 is effectively doubled without any loss in the ability to read such information. The stages (FIG. 7) sampling and evaluating the binary coded information read by the fast port 18 from the memory 10 also operate advantageously in extending the time for the evaluation of the sampled signals in the next half cycles after each such sampling. The circuitry shown in FIG. 8 then applies such evaluated signals to the line 288 on an exclusive basis whereby the signal from only one of the output lines 226, 228, 252, and 254 can be introduced to the line at each instant.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination, first and second lines for receiving signals each having first and second logic levels and each representing an inverse of binary information represented by the other, third and fourth lines, first and second cascode means for respectively receiving the signals on the first and second lines and for respectively producing amplified signals on the third and fourth lines in accordance with the logic levels of the signals on the first and second lines, each of the first and second cascode means including a transistor with a source, a gate and a drain, the gates of the transistors in the first and second cascode means receiving a constant bias voltage, the sources of the transistors in the first and second cascode being respectively connected to the first and second lines, first and second current control means respectively coupled to the third and fourth lines and to the drains of the transistors in the first and second cascode means and biased to produce a flow of current at a low amplitude, the first and second current control means being respectively connected to the drains of the transistors in the first and second cascode means, first and second common mode means respectively coupled to the first and second lines and respectively coupled to the sources of the transistors in the first and second cascode means in a common mode for providing for a substantially constant flow of current through the first and second common mode means, the transistors providing at their respective sources an impedance which is reduced by the flow of the substantially constant current through the first and second common mode means.

2. In a combination as set forth in claim 1, the first and second cascode means constituting cascode amplifiers and the first and second common mode means being connected to a common reference voltage.

3. In a combination as set forth in claim 1, each of the first and second current control means and the first and second common mode means including a transistor, the transistors in the first current control means and the first common mode means being connected in a series circuit with the transistor in the first cascode means and the transistors in the second current control means and the second common mode means being connected in a series circuit with the transistor in the second cascode means.

4. In a combination as set forth in claim 1, the first cascode means, the first current control means and the first common mode means being connected in a series circuit, and the second cascode means, the second current control means and the second common mode means being connected in a series circuit.

5. In combination, first and second lines for respectively providing first and second signals each having first and second logic levels respectively representing a binary "1" and a binary "0", logic levels of signals on the first line being complementary to logic levels of signals on the second line, first and second current control means respectively biased to produce currents of low amplitudes, first and second common mode means respectively responsive to the first and second signals and connected to each other in a common mode to provide for a substantially constant current through the first and second common mode means, and first and second cascode means respectively connected to the first and second current control means and respectively connected to the first and second common mode means and respectively responsive to the first and second signals to provide a gain in such signals, each of the first and second cascode means including a transistor with a source, a gate and a drain, the drains of the transistors in the first and second cascode means being respectively connected to the first and second current control means, the gates of the transistors in the first and second cascode means receiving a constant bias voltage, the sources of the transistors in the first and second cascode means being respectively connected to the first and second common mode means, the transistors in the first and second cascode means being responsive to the flow of the substantially constant current through the first and second common mode means to provide low impedances at their respective sources in accordance with the flow of the substantially constant current through the first and second common mode means and to provide the common mode between the first and second lines.

6. In a combination as set forth in claim 5, a first intermediate output line connected to the drain of the transistor in the first cascode means, and a second intermediate output line connected to the drain of the transistor in the second cascode means.

7. In a combination as set forth in claim 6, the first and second cascode means including cascode amplifiers respectively connected to the first and second current control means.

8. In a combination as set forth in claim 6, the first current control means, the first cascode means and the first common mode means being connected in a series circuit, and the second current control means, the second common mode means and the second cascode means being connected in a series circuit.

9. In a combination as set forth in claim 8, each of the first and second current control means and the first and second common mode means including a transistor, the transistors in t he first current control means and the first common mode means being connected in a series circuit with the transistor in the first cascode means and the transistors in the second current control means and the second common mode means being connected in a series circuit with the transistor in the second cascode means.

10. In combination, first and second transistors each respectively having a source, a gate and a drain, means for applying an energizing voltage to the source of each of the first and second transistors, means for biasing the gate of each of the first and second transistors to produce a flow of current at a low amplitude through each of the transistors, first and second lines for respectively providing first and second signals each having first and second logic levels representing respectively a binary "1" and a binary "0" and each providing logic levels complementary to logic levels of the other one of the first and second signals, a pair of cascode amplifiers each coupled to an associated one of the first and second transistors to receive the current of low amplitude from the associated one of the first and second transistors and each responsive to an associated one of the first and second signals to produce an output at the drain of the associated one of the first and second transistors in response to the associated one of the first and second signals, each of the cascode amplifiers including a transistor having a source, a gate and a drain, the drain of the transistor in each of the cascode amplifiers being connected to the drain of the associated one of the first and second transistors, the gates of the transistors in the cascode amplifiers receiving a constant bias voltage, the source of the transistor in each of the cascode amplifiers being connected to receive the associated one of the first and second signals, and a pair of conductive means each connected to the source of the transistor in a respective one of the cascode amplifiers and to a respective one of the first and second lines, and each connected to the other conductive means in the pair in a common mode for providing a substantially constant current through each of the conductive means in the pair, the transistor in each of the cascode amplifiers providing at the source an impedance which is reduced by the flow of the substantially constant current through the associated one of the conductive means in the pair.

11. In a combination as set forth in claim 10, each of the conductive means including a transistor having a gate, a source and a drain, means for biasing the gate of the transistor in each of the conductive means in the pair with the constant bias voltage, means for respectively connecting the first and second lines to the drains of the transistors in the associated conductive means in the pair, the source of the transistor in each of the conductive means in the pair being connected to a reference potential.

12. In a combination as set forth in claim 10, the first transistor, the associated one of the cascode amplifiers and one of the conductive means in the pair being connected in series and the second transistor, the other one of the pair of cascode amplifiers and the other one of the conductive means in the pair being connected in series.

13. In a combination as set forth in claim 12, each of the conductive means including a transistor having a gate, a source and a drain, first and second intermediate output lines respectively connected to the drains of the transistors in the cascode amplifiers, means for biasing the gate of the transistor in each of the conductive means with the constant bias voltage, means for connecting the source of the transistor in each of the conductive means to a reference voltage, and means for connecting the drain of the transistor in each of the conductive means in the pair to the source of the transistor in the respective one of the cascode amplifiers.

14. In combination, first and second transistors each having a gate, a source and a drain, means for biasing the gate of each of the first and second transistors to a particular voltage, first and second lines for respectively providing first and second signals each having first and second logic levels representing respectively a binary "1" and a binary "0" and each providing logic levels complementary to logic levels of the other one of the first and second signals, means for respectively connecting the first and second lines to the sources of the first and second transistors, first and second current control means each providing a current at a low amplitude and each connected to the drain of a respective one of the first and second transistors, and first and second common mode means connected to each other in a common mode, each of the first and second common mode means being connected to the source of an associated one of the first and second transistors and to a respective one of the first and second lines for providing for a flow of a substantially constant current through the first and second common mode means, each of the first and second transistors providing at its source an impedance which is reduced by the flow of the current through the respective one of the first and second common mode means, and first and second intermediate output lines each connected to the drain of a respective one of the first and second transistors for producing a flow of current in accordance with the logic level of the respective one of the first and second signals.

15. In a combination as set forth in claim 14, each of the first and second current control means including a transistor having a gate, a source and a drain, means for biasing the gate of the transistor in each of the first and second current control means to a bias voltage, means for connecting said particular voltage to the source of each of the transistors in the first and second current control means, and means for connecting the drain of the transistors in each of the first and second current control means to the drain of the respective one of the first and second transistors.

16. In a combination as set forth in claim 14, each of the first and second common mode means including a transistor having a gate, a source and a drain, means for connecting the sources of the transistors in the first and second common mode means to a reference potential, means for connecting the particular voltage to the gates of the transistors in the first and second common mode means, and the drain of the transistor in each of the first and second common mode means being connected to the source of the respective one of the first and second transistors.

* * * * *